US006816431B1

United States Patent
Lu et al.

(10) Patent No.: US 6,816,431 B1
(45) Date of Patent: Nov. 9, 2004

(54) MAGNETIC RANDOM ACCESS MEMORY USING MEMORY CELLS WITH ROTATED MAGNETIC STORAGE ELEMENTS

(75) Inventors: Yu Lu, Hopewell Junction, NY (US); William Robert Reohr, Ridgefield, CT (US); Roy Edwin Scheuerlein, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/446,297

(22) Filed: May 28, 2003

(51) Int. Cl.[7] .............................................. G11C 11/15
(52) U.S. Cl. .............................. 365/230.07; 365/225.5; 365/173; 365/171; 365/158; 365/51; 365/66
(58) Field of Search ................................ 365/173, 171, 365/158, 51, 66, 63, 209, 225.5, 230.07

(56) References Cited

U.S. PATENT DOCUMENTS 5,343,422 A  *  8/1994  Kung et al. ................. 365/173
5,640,343 A  *  6/1997  Gallagher et al. ........... 365/171
5,930,164 A     7/1999  Zhu ............................ 365/158
6,005,800 A  * 12/1999  Koch et al. .................. 365/173

OTHER PUBLICATIONS

W. Reohr et al., "Memories of Tomorrow," IEEE Circuits & Devices Magazine, vol. 18, No. 5, pp. 17–27, Sep. 2002.

* cited by examiner

Primary Examiner—Andrew Q. Tran
(74) Attorney, Agent, or Firm—Wan Yee Cheung; Ryan, Mason & Lewis, LLP

(57) ABSTRACT

A magnetic random access memory circuit comprises a plurality of magnetic memory cells, each of the memory cells including a magnetic storage element having an easy axis and a hard axis associated therewith, and a plurality of column lines and row lines for selectively accessing one or more of the memory cells, each of the memory cells being proximate to an intersection of one of the column lines and one of the row lines. Each of the magnetic memory cells is arranged such that the easy axis is substantially parallel to a direction of flow of a sense current and the hard axis is substantially parallel to a direction of flow of a write current.

13 Claims, 6 Drawing Sheets

MAGNETIC RANDOM ACCESS MEMORY USING MEMORY CELLS WITH ROTATED MAGNETIC STORAGE ELEMENTS

STATEMENT OF GOVERNMENT RIGHTS

This invention was made with Government support under grant contract number MDA972-99-C-0009 awarded by the Defense Advanced Research Projects Agency (DARPA) of the United States Department of Defense. The Government has certain rights in this invention.

FIELD OF THE INVENTION

The present invention relates generally to memory circuits, and more particularly relates to a magnetic random access memory (MRAM) circuit employing rotated magnetic storage elements.

BACKGROUND OF THE INVENTION

FIG. 1A illustrates a conventional magnetic tunnel junction (MTJ) device 100. The MTJ 100 is typically comprised of a stack of two ferromagnetic layers (ML) separated by a tunnel barrier (TL) at a cross-point of two conductors, one of which may be a word line (WL) and the other a bit line (BL). One of the two magnetic layers is often referred to as a free magnetic layer. The magnetic orientation of the free magnetic layer can be changed by the superposition of magnetic fields generated by programming currents $I_{WL}$ and $I_{BL}$ flowing in the conductors WL and BL, respectively. The other of the two magnetic layers ML is often referred to as a fixed magnetic layer. The programming currents $I_{WL}$ and $I_{BL}$ cannot change the magnetic orientation of the fixed magnetic layer. The logical state (e.g., a "0" bit or a "1" bit) is stored in the MTJ 100 by changing the orientation of the free magnetic layer relative to the fixed magnetic layer. When both magnetic layers have the same orientation 102, the MTJ 100 typically has a low resistance $R_C$ associated therewith, as measured between conductors WL and BL, and in this case $R_C$ is more specifically referred to as $R_{parallel}$. Likewise, the resistance $R_C$ of the MTJ 100 is generally high when the magnetic layers are oriented in opposite directions 104 with respect to one another, and in this case $R_C$ is more specifically referred to as $R_{antiparallel}$.

A single bit of information may be selectively written into an MTJ memory cell embedded within a two-dimensional array of such cells by applying coincident and orthogonal magnetic fields within the plane of the MTJ. In conventional MTJ MRAM, the programming currents $I_{WL}$ and $I_{BL}$ generate a hard axis field and an easy axis field, respectively, that change the magnetic orientation of the free magnetic layer, ML (free). The current $I_{BL}$ generates the easy axis field that partially selects the MTJ memory cell to be written. Of equal significance, the sign Of $I_{BL}$ sets the state of the selected MTJ memory cell. Hence, the write current flowing through the bit line BL, namely, $I_{BL}$, must flow conditionally in one of two directions, and will be referred to henceforth as a bidirectional write current. The current $I_{WL}$ generates the hard axis field that partially selects the MTJ memory cell to be written. In contrast to $I_{BL}$, the write current flowing through the word line WL, namely, $I_{WL}$, need only flow in one direction and will be referred to henceforth as a write select current.

A conventional MRAM generally includes a plurality of MTJ devices connected in an array configuration. FIG. 1B illustrates a conventional cross-point memory array, wherein each memory cell comprises a single MTJ device coupled at an intersection of a word line (e.g., $WL_{k-1}$, $WL_k$, $WL_{k+1}$) and a corresponding bit line (e.g., $BL_{i-1}$, $BL_i$, $BL_{i+}$). MRAM circuits are discussed in further detail, for example, in the article by W. Reohr et al., entitled "Memories of Tomorrow," *IEEE Circuits and Devices Mag.*, pp. 17–27, Vol. 18, No. 5, September 2002, which is incorporated herein by reference.

Generally, within the cross-point memory array, the write select current is required to aid in the selection of one or more memory cells in the array. One or more bidirectional write currents, corresponding to one or more respective memory cells of a one or more bit word, are required for writing the selected memory cells to a zero or one logical state. Word lines and bit lines routed throughout the memory array convey the programming current and sense current for writing and reading, respectively, selected memory cells in the array.

In a conventional cross-point MRAM device, during a read operation, the bit lines convey the sense current between a sense amplifier and the memory cell to read the state of the memory cell. During a write operation, the bit lines convey the bidirectional write current in close proximity to the MTJ device of the selected memory cell to write the selected memory cell, while a word line simultaneously conveys the write select current in close proximity to the aforementioned MTJ device to write the selected memory cell.

Since the sense current is substantially smaller in magnitude than either of the programming currents (e.g., about 50 microamperes versus about 5 milliamperes, respectively), the sense current is considerably more sensitive to noise. Additionally, the read access time of the memory array depends, to a large extent, on reliably extracting the state of the memory cell from this relatively small sense current. Consequently, the number of memory cells that can be placed along a given bit line should be limited to minimize the read access time of the memory array.

Since the supply voltage applied to modem memory devices is typically constrained to below three volts and the sheet resistance of metal interconnects is typically close to about 0.1 ohm, the large programming currents required in the memory array limit the number of memory cells that can be placed along the bit line or word line dimensions. Therefore, reducing the number of memory cells along a bit line dimension to increase read access time, as previously stated, without also increasing the number of memory cells along a word line dimension would undesirably reduce the array efficiency, which can be defined as a percentage of the total semiconductor area devoted to the memory cells.

There exists a need, therefore, for an improved MRAM circuit which provides an increased read access time without significantly reducing the array efficiency of the MRAM device. Furthermore, it would be desirable to provide an improved 1T1MTJ (one transistor/one MTJ) HAM circuit that enables a smaller memory cell size to be realized.

SUMMARY OF THE INVENTION

The present invention provides techniques for forming an MRAM circuit having a plurality of memory cells advantageously arranged such that a read line and a corresponding write line associated with a given memory cell are spatially separated from one another at least in part to enable optimization of read and write operations. The techniques of the present invention may be further used for reducing the size of memory cells within a 1T1MTJ MRAM circuit. To accomplish these goals, at least a portion of a plurality of magnetic storage elements are selectively rotated, in comparison to conventional MRAM circuits, so that an easy axis associated with each of the magnetic storage elements is substantially parallel to a direction of sense current flow and a hard axis associated with the magnetic storage elements is substantially parallel to a direction of bidirectional write current flow.

In accordance with one aspect of the invention, a magnetic random access memory circuit comprises a plurality of magnetic memory cells, each of the memory cells including a magnetic storage element having an easy axis and a hard axis associated therewith, and a plurality of column lines and row lines for selectively accessing one or more of the memory cells, each of the memory cells being proximate to an intersection of one of the column lines and one of the row lines. Each of the magnetic memory cells is arranged such that the easy axis is substantially parallel to a direction of flow of a sense current and the hard axis is substantially parallel to a direction of flow of a write current. In this manner, the read and write ports associated with the memory circuit can be spatially separated from one another, thereby enabling the read and write operations to be independently optimized.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 3A is a schematic diagram illustrating at least a portion of a cross-point MRAM circuit.

DETAILED DESCRIPTION OF PREFERRED EMBODIMENTS

The present invention will be described herein in the context of an illustrative cross-point MRAM array. The invention, however, is more generally applicable to techniques for improving the read access time of an MRAM array by providing an architecture in which read and write ports associated with at least a portion of the memory cells in the array are spatially separated from one another. Although implementations of the present invention may be described herein with reference to magnetic tunnel junction (MTJ) devices, it should be appreciated that the invention is not limited to such devices, and that other suitable devices, such as, for example, other magneto-resistive memory elements, may be similarly employed with or without modifications to the inventive magnetic memory architecture.

As will be understood by those skilled in the art, "word lines" are generally defined as being oriented in a row or horizontal direction and are used during a conventional write operation for partially selecting one or more memory cells to be written. Likewise, "bit lines" are generally defined as being oriented in a column or vertical direction and are used during a conventional write operation for partially selecting one or more memory cells to be written and for setting the logical state of the selected memory cells. Bit lines are also used during a conventional read operation to selectively sense the logical state of one or more memory cells. It is to be appreciated, however, that the techniques of present invention described herein are not limited to this or any particular orientation of word lines and/or bit lines.

In order to fully appreciate the primary advantages of the present invention, a more detailed discussion of the unique characteristics of a magnetic memory cell (e.g., comprising an MTJ device) will first be presented. As previously stated, an MTJ memory cell is typically written by applying a combination of two magnetic fields, which are preferably orthogonal to one another, to the memory cell. Orthogonal metal conductors (e.g., word and bit lines) preferably generate the magnetic fields for writing the MTJ cell. The invention contemplates that a combination of more than two magnetic fields may be applied to write the logical state of a selected memory cell.

Only in-plane magnetic fields of a certain magnitude, directed along the length and the width of the MTJ device, will write the MTJ device to a new logical state. The two magnetic fields are generally referred to as an easy axis field and a hard axis field, respectively, which in the conventional cross-point MRAM are generated by $I_{BL}$ and $I_{WL}$ (see FIG. 1), as previously stated.

Figure 2:
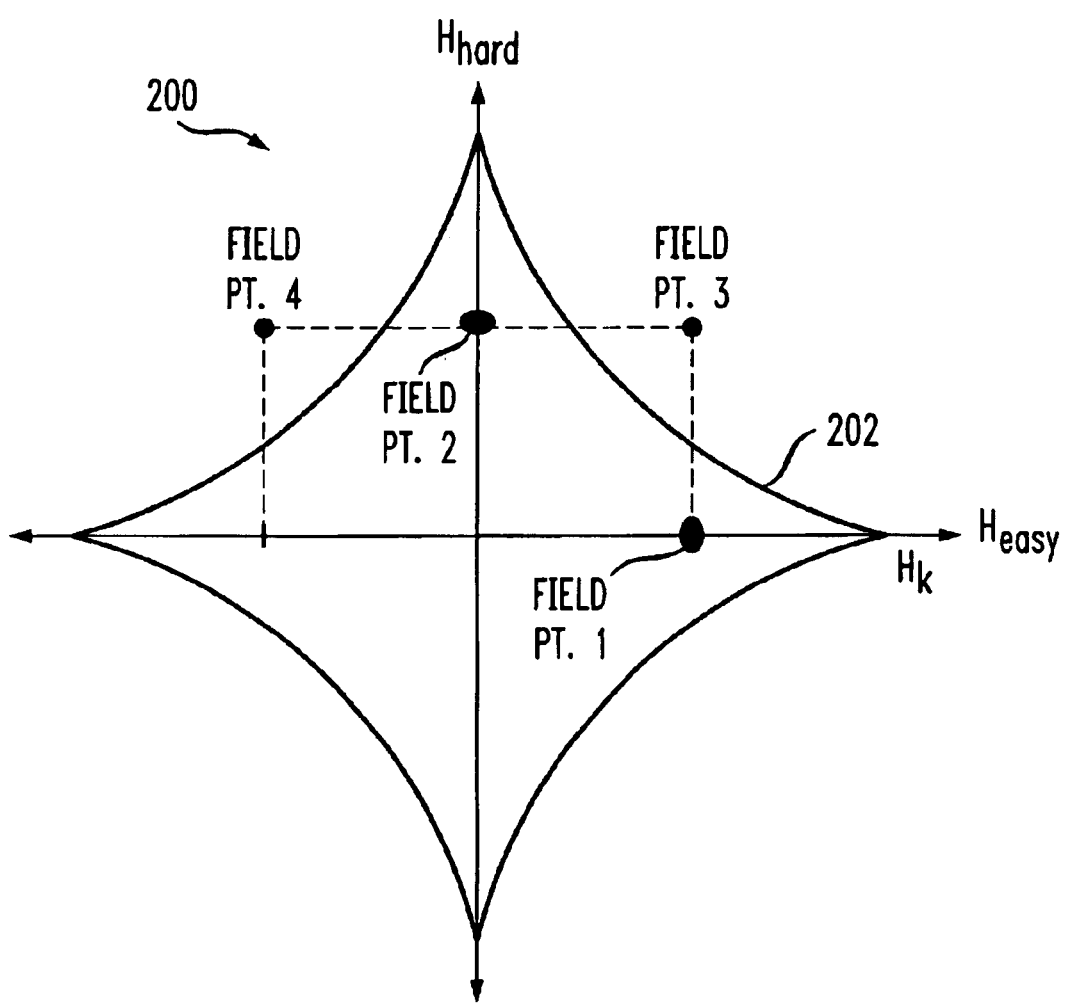
FIG. 2 is a graph depicting an ideai switching astroid.

FIG. 2 depicts an ideal switching astroid curve 200 which delineates a boundary 202 between switching and not switching the orientation of the free magnetic layer in the MTJ device. The ideal switching astroid 200 assumes single domain switching. A model for the ideal switching astroid can be derived that satisfies the relation $H_{easy}^{2/3} + H_{hard}^{2/3} = H_k^{2/3}$, where $H_{easy}$ is the easy axis field, $H_{hard}$ is the hard axis field and $H_k$ is an anisotropy field.

As previously explained, the combination of magnetic fields $H_{hard}$ and $H_{easy}$ write the MTJ device to a predetermined logical state. Within the boundary 202 of the switching astroid 200, the combined magnetic fields are small enough that they will not change the orientation of the free magnetic layer in the MTJ device. Outside the boundary 202 of the switching astroid, the applied magnetic fields are large enough that they can determine the orientation of the free magnetic layer in the MTJ device regardless of its prior orientation. In this manner, the free magnetic layer can be set in either a parallel or antiparallel state, in relation to the fixed magnetic layer in the MTJ device, giving rise to a characteristically low resistance, $R_{parallel}$ or high resistance, $R_{antiparallel}$, respectively.

The two orthogonal fields, when considered individually, are preferably too small to write the MTJ device. For example, magnetic field $H_{easy}$, represented by field point 1 directed along the easy axis, and magnetic field $H_{hard}$, represented by field point 2 directed along the hard axis, are both within the boundary 202 of the switching astroid and thus will not, by themselves, change the orientation of the free magnetic layer in the MTJ device. Only a combination of $H_{easy}$ and $H_{hard}$, represented by field point 3, exceeds the switching astroid boundary 202 and writes the MTJ device to a new state, its free magnetic layer aligning generally with $H_{easy}$. Had $H_{easy}$ been negative rather than positive, resulting in the field combination represented by field point 4, the orientation of the free magnetic layer in the MTJ device would have been reversed compared to that of field point 3.

Figure 1A:
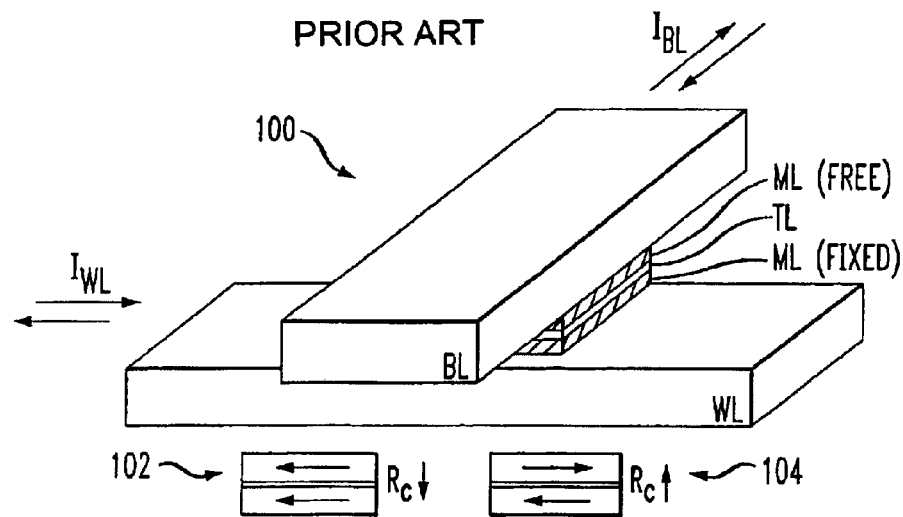
FIG. 1A is an illustration depicting a conventional magnetic tunnel junction device.
Figure 1B:
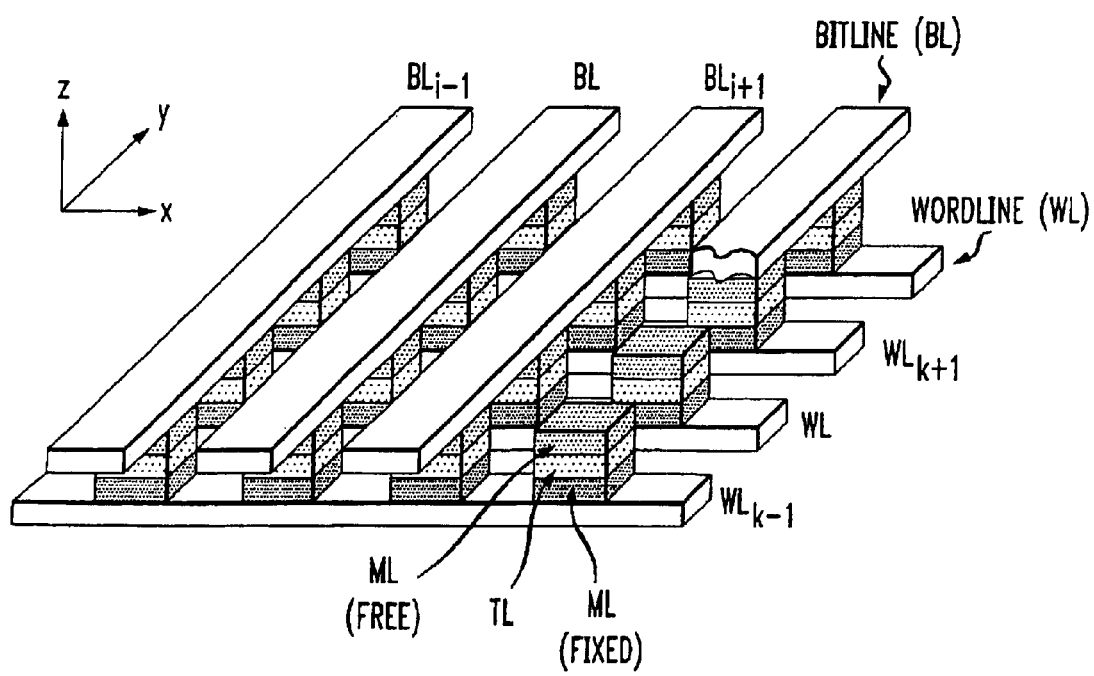
FIG. 1B is an illustration depicting at least a portion of a conventional cross-point memory array.

It is important to understand that the $H_{hard}$ field does not substantially define the orientation of the free magnet residing in the free magnetic layer in the MTJ device of FIG. 1. Rather, it only helps to destabilize the free magnet so that the $H_{easy}$ field can be simultaneously applied to change the orientation of the free magnet within the free magnetic layer. This property is exploited in a two dimensional cross-point magnetic memory array, where the coincident application of $H_{easy}$ and $H_{hard}$ fields writes only the MTJ device defined as a selected memory cell in the memory array. Other memory cells that incidentally receive one or the other field alone are not written.

Figure 3A:
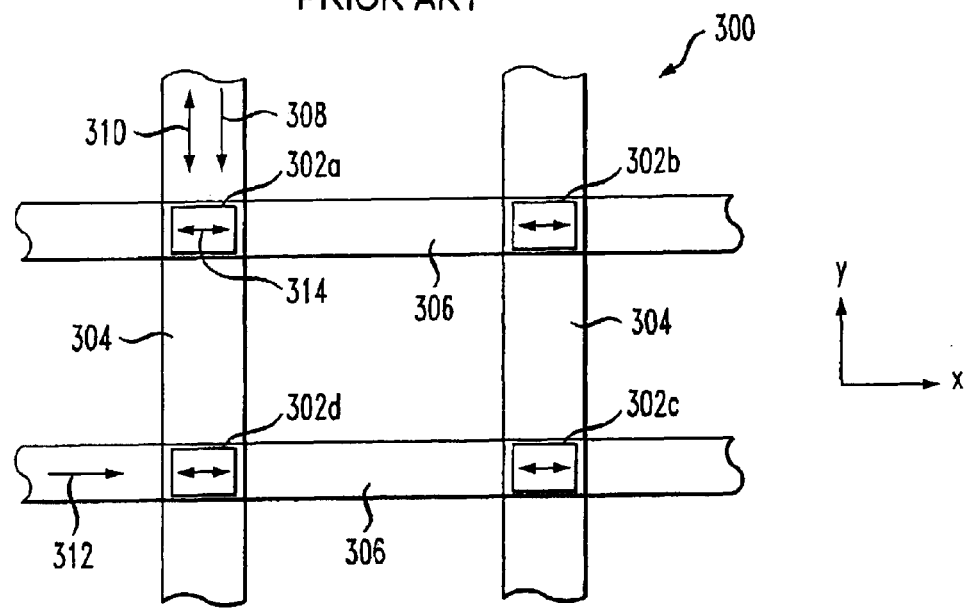
FIG. 3A is a top-down view illustrating at least a portion of a cross-point memory array.

FIG. 3A illustrates at least a portion of a cross-point MRAM array 300 including a plurality of bit lines 304 and word lines 306 arranged orthogonal to one another. A plurality of memory cells 302a, 302b, 302c and 302d are also included, with each memory cell residing at an intersection of a bit line and a corresponding word line. Memory cells 302a through 302d may be referred to herein collectively as 302. Conventional cross-point MRAM arrays generally employ magnetic memory cells 302 arranged so that an easy axis 314 associated with each memory cell 302 is oriented parallel to the write select current 312 and orthogonal to the bidirectional write current 310 and sense current 308. It is to be appreciated that the present invention similarly contemplates that a sense voltage may also be used to determine the logical state of a given memory cell. It is also important to note that the bit lines 304 are substantially wider as well as shorter per cell than the word lines 306, and therefore, the bit lines 304 have a lower resistance per unit cell than the word lines 306.

The currents required to write an MTJ comprise the bidirectional write current 310 and write select current 312. As previously discussed, the coincident application of an easy axis field and a hard axis field write a selected MTJ to a new state. The bidirectional write current 310 generates the easy axis field, the positive or negative orientation of which defines the new state of the selected MTJ. The write select current 312 generates the hard axis field that, in combination with the easy axis field, selects an MTJ for a write operation. Additionally, it is important to recognize that the sense current 308 is critical for ascertaining the state of a memory cell. During a read operation, the sense current 308 retrieves MTJ state information from a selected memory cell. In the context of the present invention, the sense current 308 may comprise a current, a voltage, or any combination thereof, so long as it conveys information for determining the logical state of the MTJ.

Figure 3B:
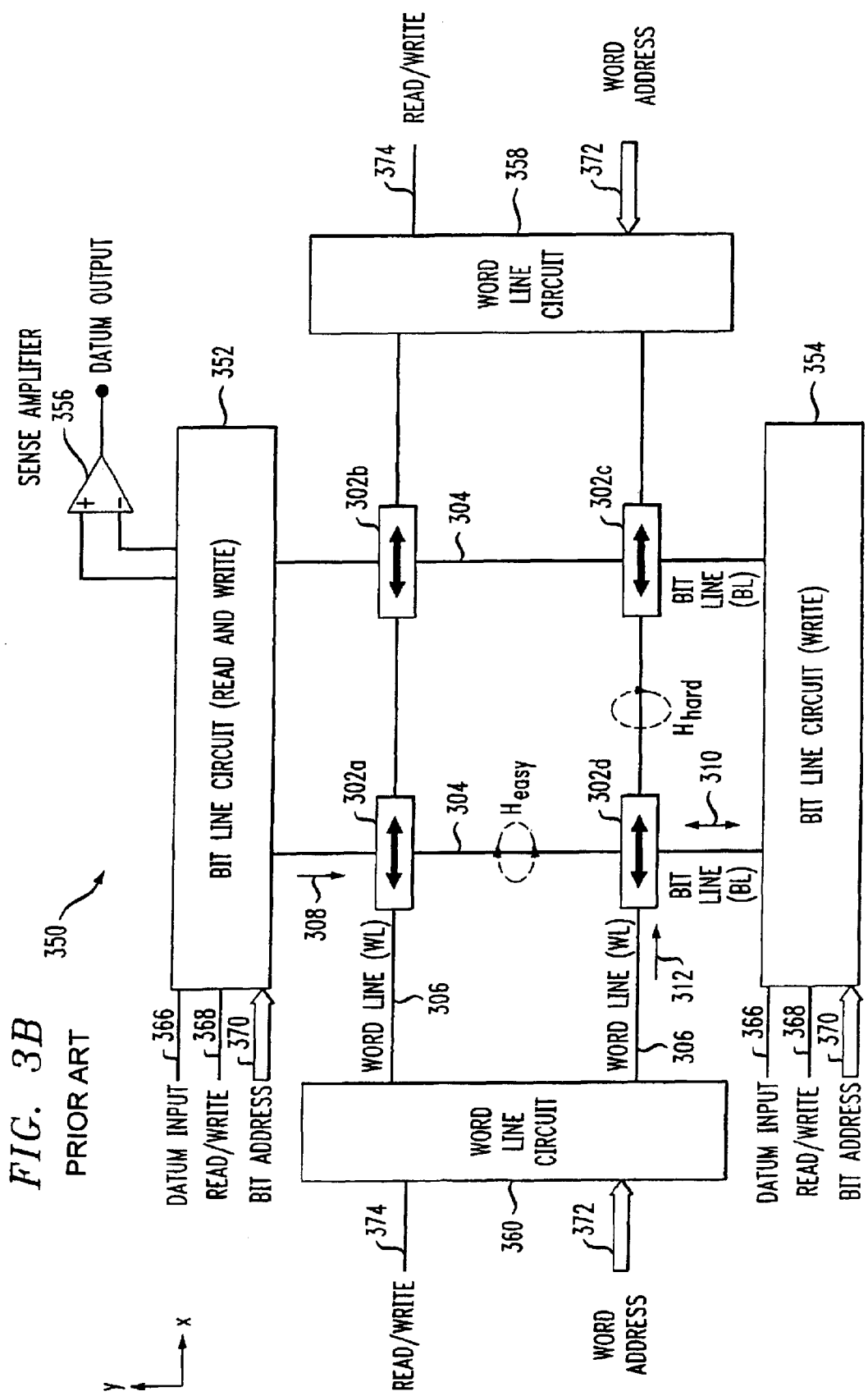

FIG. 3B illustrates at least a portion of a cross-point MRAM circuit 350 which comprises the MRAM array shown in FIG. 3A, including a plurality of bit lines (BL) 304 and word lines (WL) 306 coupled to a plurality of memory cells 302. The MRAM circuit 350 further includes bit line circuits 352 and 354 connected to opposite ends of the bit lines 304, and word line circuits 358 and 360 coupled to opposite ends of the word lines 306. The bit line circuits 352, 354 are used for reading and writing the logical state of one or more of the memory cells 302 while the word line circuits 358, 360 are used for write selection. During a read operation, a sense amplifier 356 operatively coupled to bit line 304 through bit line circuit 352 determines the logical state of a selected memory cell (e.g. 302) with sense current 308 and generates a datum output signal corresponding thereto.

Bit line circuits 352, 354 generate the bidirectional write current 310 and sense current 308 for writing and reading, respectively, the logical state of one or more of the memory cells 302a through 302d. The bit line circuits 352, 354 include a datum input 366, for receiving a datum input signal, and a read/write input 368, for receiving a read/write signal. The read/write signal is used to control whether the bit line circuits 352, 354 are functioning in a read or write mode of operation, while the datum input signal is used to control which logical state is to be written into the selected memory cell(s) during the write operation. A bit address 370 applied to bit line circuits 352, 354 is preferably used to select the desired bit line 304 in the MRAM circuit 350 through which the bidirectional write current 310 will be conveyed.

The word line circuits 358, 360 generate the write select current 312 for selecting one or more of the memory cells 302a through 302d for writing. A word address 372 applied to the word line circuits 358, 360 is used to select the particular word line 306 on which the write select current 312 will be carried. The word line circuits 358, 360 may further include a read/write input 374 for controlling a mode of operation of the word line circuits 358, 360 in response to a read/write signal applied to the read/write input.

One disadvantage of this MRAM circuit 350 is that it is difficult to limit the number of memory cells along a given bit line to thereby improve the read access time of the cross-point MRAM array without significantly reducing the array efficiency (i.e., the percentage of the total area devoted to the memory cells). The read access time of the memory array depends, to a large extent, on the reliability of extracting the logical state of a given memory cell from a small sense current 308 (e.g., about 50 microamperes). The sense current 308 is significantly smaller in comparison to the bidirectional write current 310, which may be on the order of about 5 milliamperes (mA). It is desirable to reduce the resistance-capacitance (RC) time constant associated with the bit lines by limiting the number of memory cells along a given bit line to improve the read access time of the overall cross-point MRAM array. The length of the word line is substantially limited, at least in part, by the higher word line resistance per cell and the size of the write select current, thereby precluding the possibility of reducing the number of cells along the bit line and increasing the number of cells along the word line to achieve the aforementioned improvements of read access time without reducing the array efficiency.

Figure 4A:
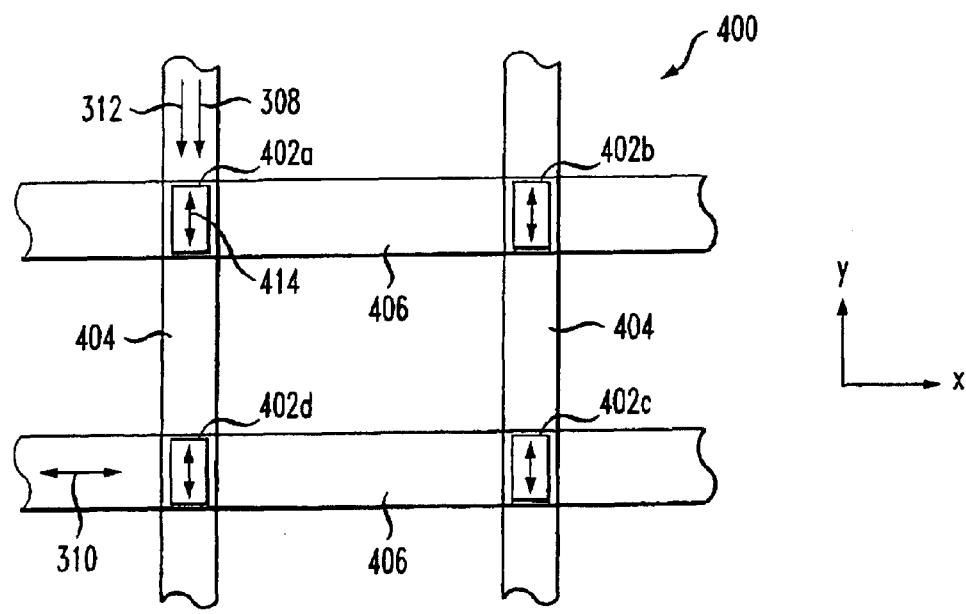
FIG. 4A is a top-down view illustrating at least a portion of an exemplary cross-point memory array, formed in accordance with one embodiment of the present invention.

FIG. 4A depicts at least a portion of an illustrative cross-point MRAM array 400 in which the techniques of the present invention may be implemented. As apparent from the figure, the MRAM array 400 includes a plurality of column lines 404 and row lines 406 arranged orthogonally with respect to one another. It is to be appreciated that the architecture of the present invention is not limited to this or any particular orientation of the column and row lines. The illustrative MRAM array 400 further includes a plurality of magnetic memory cells 402a, 402b, 402c and 402d, which preferably comprise a single MTJ device functioning as a storage element. Memory cells 402a through 402d may be referred to herein collectively as 402.

Each of at least a portion of the memory cells 402 are disposed at an intersection of a column line 404 and a corresponding row line 406. For these shape-anisotropy dominated memory cells 402, each of the cells has an easy axis 414 along a long dimension (e.g., y-axis) of the memory cells and a hard axis (not shown) associated therewith along a short dimension (e.g., x-axis), as previously stated. In this transistor-less memory cell embodiment, the memory cells 402 are electrically coupled to the column lines 404 and row lines 406.

An important aspect of the present invention is that the orientation of magnetic memory cells 402 in the MRAM array 400 are rotated, compared to the orientation of conventional memory cells, so as to enable the row lines 406 to be substantially wider and shorter per cell than the column lines 404. Since the row lines 406 are substantially wider and shorter per cell than the column lines 404, the row lines are more electrically conductive per cell than the column lines. Without substantially sacrificing array efficiency, more memory cells can be stacked along a particular row line 406 in MRAM array 400 compared to a given word line 306 in MRAM array 300. Consequently, fewer memory cells need be stacked along a particular column line 404 in MRAM array 400, as compared to a given bit line 304 in MFA array 300, to still achieve a reasonable memory array efficiency. With fewer memory cells stacked along a given column line 404, the read access time in the memory array 400 is advantageously increased.

Using the memory architecture of the present invention, the row lines 406 in MRAM array 400 can be advantageously optimized for current carrying capability and reduction of nearest-neighbor magnetic fields, while the column lines 404 can be optimized for low capacitance and/or resistance and noise matching. In this manner, the read and write operations can be individually optimized as desired, without sacrificing array efficiency, as previously explained. In addition, it is also important to note that in MRAM array 400, the bidirectional write current 310 is conveyed by the row lines 406 while the sense current 308 is conveyed by the column lines 404. As such, read circuitry can be placed in the column dimension and write circuitry can be placed in the row dimension, thus spatially separating the functional circuitry for reading and writing.

In accordance with one aspect of the invention, the above advantages can be accomplished by rotating the memory cells 402 by about ninety degrees, compared to the memory cells 302 of cross-point MRAM array 300, so that the easy axes 414 of the memory cells are substantially parallel to the column lines 404. With the memory cells 402 oriented in this manner, the bidirectional write current 310 is preferably carried via the row lines 406, while the sense current 308 and write select current 312 are preferably carried via the column lines 404, as stated above.

Figure 4B:
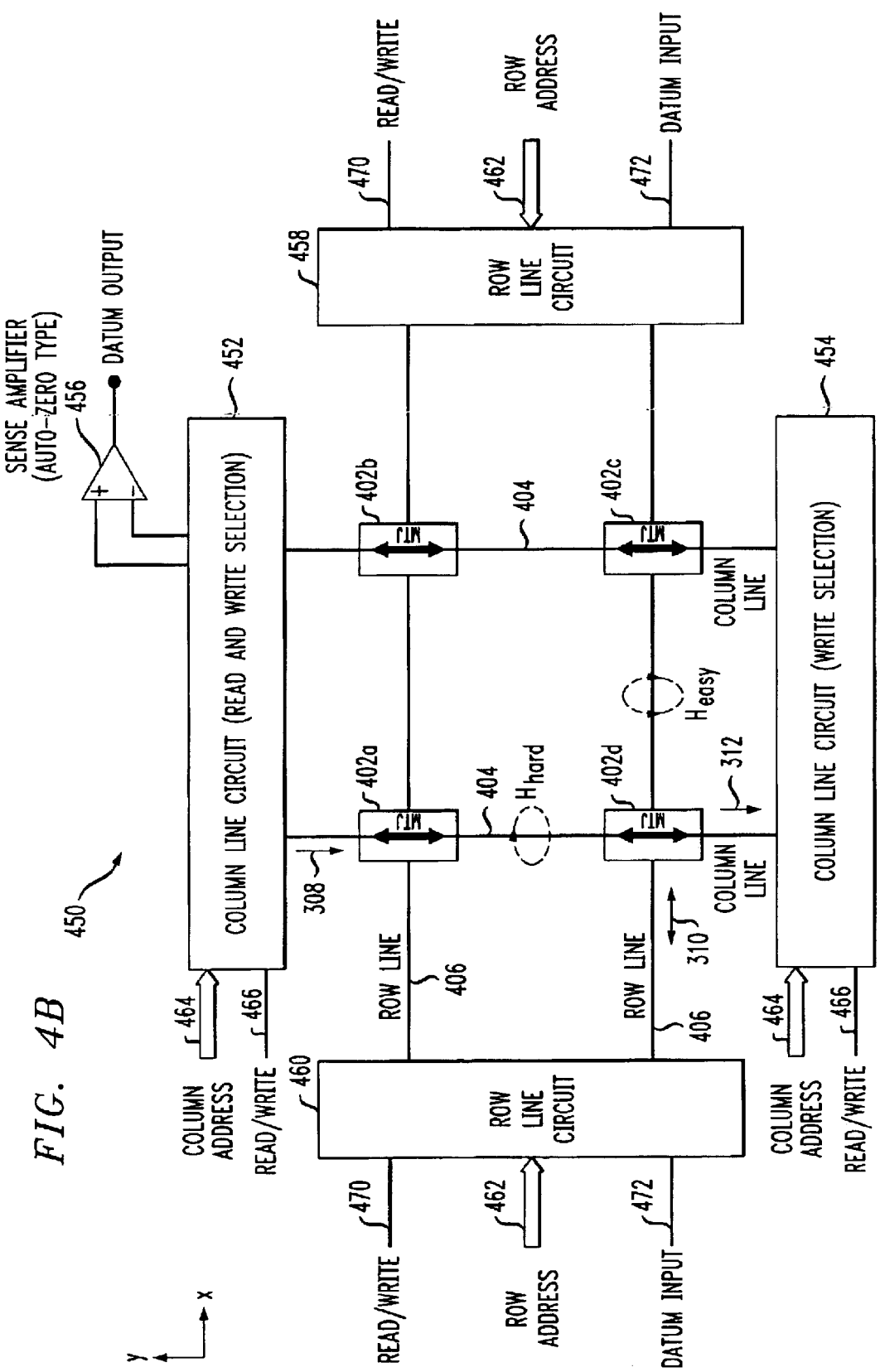
FIG. 4B is a schematic diagram illustrating at least a portion of an exemplary MRAM circuit, formed in accordance with one embodiment of the present invention.

FIG. 4B depicts at least a portion of an illustrative MRAM circuit 450 in which the techniques of the present invention may be implemented. The MRAM circuit 450 comprises at least a portion of the cross-point MRAM array 400 shown in FIG. 4A, including column lines 404 and row lines 406 arranged orthogonally with respect to one another, although the architecture of the present invention is not limited to this or any particular orientation of the column and row lines. The illustrative MRAM circuit 450 further includes memory cells 402a, 402b, 402c and 402d, each of which preferably comprises a single MTJ device functioning as a storage element. Each of the memory cells 402 is preferably disposed at an intersection of a given column line 404 and a corresponding row line 406, as previously explained in connection with FIG. 4A.

The illustrative MRAM circuit 450 further includes a sense amplifier 456, column line circuits 452 and 454 operatively coupled to opposite ends of the column lines 404, and row line circuits 458 and 460 operatively coupled to opposite ends of the row lines 406. Although depicted as a single amplifier, sense amplifier 456 may in fact comprise a plurality of sense amplifiers (e.g., one sense amplifier corresponding to each bit line). In the case where multiple sense amplifiers are employed, each of the plurality of sense amplifiers is preferably coupled to at least one of the column line circuits 452, 454 which, during a write operation, operatively connects a given sense amplifier to a respective column line 404. At least one of the column line circuits 452, 454 operatively couples a sense current 308 from one of the memory cells 402 to the sense amplifier 456, via a selected column line 404, during a read operation and selectively directs a write select current 312 in close relative proximity to at least one column of memory cells, via a selected column line 404, during a write operation. Thus, column line circuits 452, 454 are configurable for selectively reading the logical state of one or more memory cells 402 and for write selection of one or more desired memory cells during a read or write operation, respectively. Similarly, at least one of the row line circuits 458, 460 preferably generates a bidirectional write current 310 during the write operation, and is thus configurable for writing the logical state of one or more selected memory cells in the MRAM circuit 450.

During a read operation, the sense amplifier 456 connected to at least one of the column line circuits (e.g., 452) is configurable for determining the logical state of a given memory cell and for generating a datum output (e.g., "0" or, "1") corresponding thereto. This may be accomplished, for example, by forcing a voltage across a selected memory cell 402 via a corresponding column line 404 and measuring the resulting sense current 308 flowing through the memory cell in comparison to a reference current. Likewise, the present invention contemplates that a sense current may be forced through a selected memory cell and the resulting voltage across the selected cell can be measured in comparison to a reference voltage. The reference current and/or voltage, which may be generated internally or externally with respect to the MRAM circuit 450, may be set such that the sense amplifier 456 can reliably distinguish between which of the two stable logical states the selected memory cell is in during the read operation.

The memory cell can be selected for reading, for example, by applying a voltage to the row line 406 corresponding to the selected memory cell that is above or below a quiescent voltage of the memory array. The quiescent voltage (e.g., a voltage halfway between a positive voltage supply, which may be VDD, and a negative voltage supply, which may be ground or VSS) may be referred to as an equipotential voltage ($V_{eq}$).

Preferably, sense amplifier 456 comprises offset cancellation circuitry (e.g., an auto-zero circuit) for substantially eliminating the effects of input offset voltage (or current) in the amplifier. Offset cancellation techniques suitable for use with the present invention are well known by those skilled in the art. Eliminating input offset error in the sense amplifier 456 is especially important since such error undesirably reduces the overall input sensitivity of the amplifier.

During a write operation, at least one of the column line circuits 452, 454 is configurable for supplying the write select current 312, via a selected column line 404, in close relative proximity to a subset of the memory cells 402 corresponding to the selected column line. As previously explained, the write select current 312 may be used to partially select one or more of the memory cells for writing. At least one of the column line circuits 452, 454 preferably includes an input for receiving a column address 464 presented thereto. During the write operation, the column address 464 may be used to select a particular column line 404 corresponding to a desired memory cell(s), on which the write select current 312 is to be conveyed. Similarly, during a read operation the column address 464 may be used to operatively couple a particular column line(s) 404, corresponding to a desired memory cell(s) to be read, to the sense amplifier 456.

Column line circuits 452, 454 may further include a read/write input 466 for receiving a read/write signal. The read/write signal may be used, at least in part, to selectively control whether the column line circuits 452, 454 are functioning in a read or a write mode of operation. As apparent from the figure, in contrast to the bit line circuits 352, 354 described in conjunction with FIG. 3B, the column line circuits 452, 454 do not require a datum input since, during the write operation, they are used primarily for write selection and not for writing the logical state of the memory cells.

As previously stated, at least one of the row line circuits 458, 460 is configurable for supplying the bidirectional write current 310, via a selected row line 406, to one or more selected memory cells 402. The write current 310 may be used to write the logical state of one or more selected memory cells in the MRAM array. At least one of the row line circuits 458, 460 preferably includes an input for receiving a row address 462 presented thereto. During the write operation the row address 462 may be used to select a particular row line 406, corresponding to a selected memory cell(s), on which the bidirectional write current 310 is to be conveyed.

Row line circuits 458, 460 may include a read/write input 470 for receiving a read/write signal. In a manner consistent with the column line circuits previously discussed, the read/write signal may be used, at least in part, to selectively control whether the row line circuits 458, 460 are in a read or a write mode of operation. In contrast to the word line circuits 358, 360 described in conjunction with FIG. 3B, at least one of the row line circuits 458, 460 further include a datum input 472 since, during the write operation, the row line circuits are used primarily for selectively writing the logical state of one or more memory cells.

Figure 5:
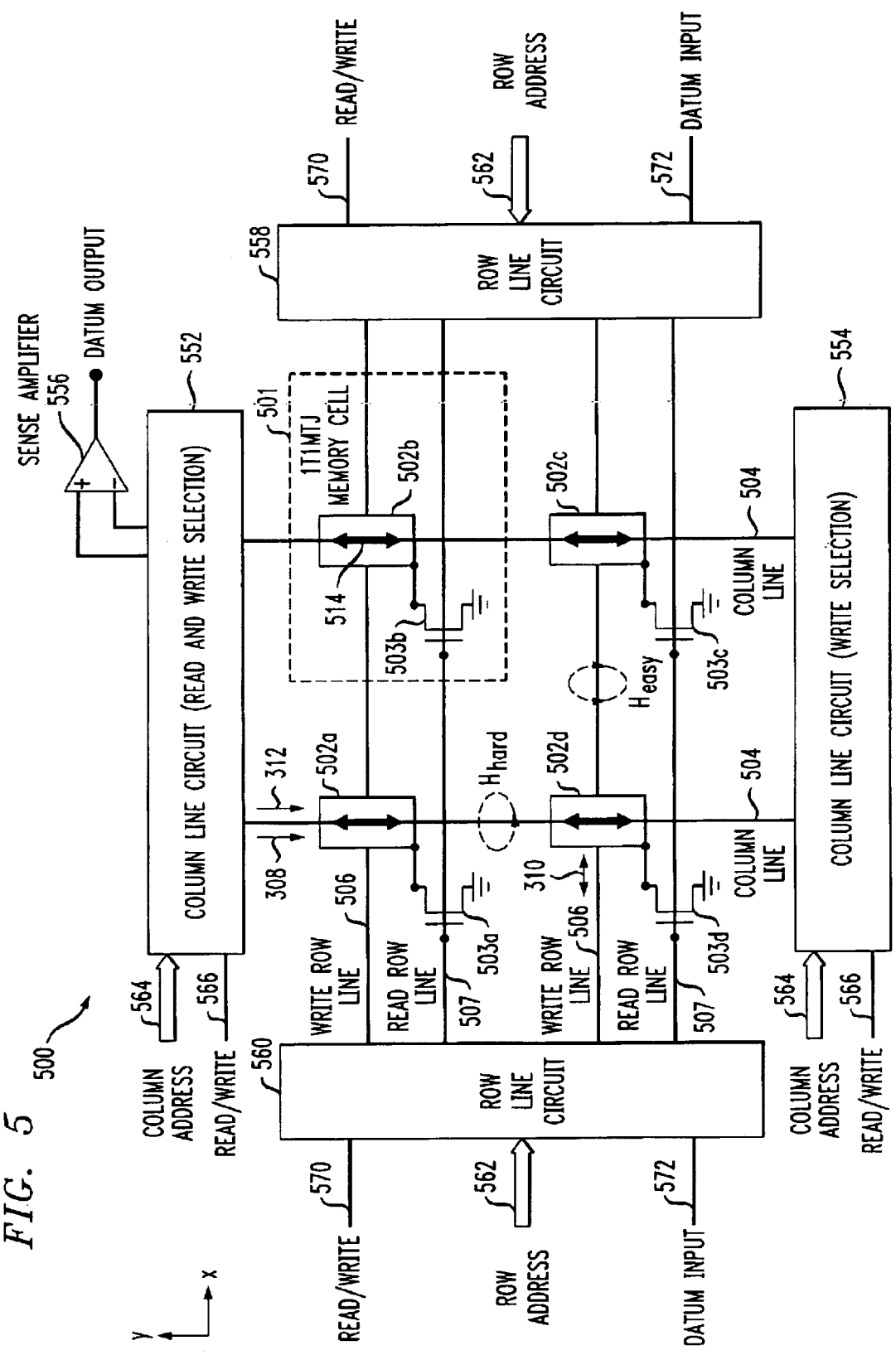
FIG. 5 is a schematic diagram illustrating at least a portion of an exemplary 1T1MTJ MRAM circuit, formed in accordance with another embodiment of the present invention.

FIG. 5 depicts an illustrative memory circuit 500 adapted for use with a 1T1MTJ memory array, in accordance with another embodiment of the invention. As will be explained herein, the techniques of the present invention can be similarly applied to the 1T1MTJ memory circuit 500 to advantageously reduce the size of one or more 1T1MTJ memory cells 501 employed therein. The illustrative memory circuit 500 includes a plurality of column lines 504, write row lines 506 and read row lines 507. The write row lines 506 and read row lines 507 are preferably arranged substantially parallel to one another, and the column lines 504 are preferably arranged substantially orthogonal to the write and read row lines. Alternative arrangements of the column lines and write and read row lines are contemplated by the invention, as will be understood by those skilled in the art. The plurality of 1T1MTJ memory cells 501 are operatively coupled to the column lines 504, write row lines 506 and read row lines 507 for selectively writing and/or reading the logical state of one or more memory cells in the array.

As apparent from the figure, each of at least a portion of the memory cells 501 may comprise an MTJ device 502a, 502b, 502c, or 502d (referred to herein collectively as 502), and a transistor 503a, 503b, 503c, or 503d (referred to herein collectively as 503), e.g., a field-effect transistor (FET) device. In a manner consistent with the configuration of the memory cells 402 depicted in FIG. 4B, each of the memory cells 501 in memory circuit 500 are rotated in comparison to a conventional MRAM array such that each of the MTJ devices 502 in the respective memory cells 501 is oriented so that its easy axis 514 is substantially parallel to a column line 504 that carries the sense current 308. Due at least in part to the oblong nature of a typical MTJ device, a rotated 1T1MTJ memory cell 501 configured such that the MTJ device 502 associated therewith oriented in accordance with the invention can be realized in a more compact physical layout compared to a conventional 1T1MTJ memory cell.

In a conventional 1T1MTJ memory cell, a contact structure is generally necessary to make electrical connection between the transistor and the MTJ device. The contact structure is typically smaller than the MTJ device itself. The techniques of the present invention exploit the observation that the physical size of the 1'T1MTJ memory cell can be beneficially reduced if the contact structure is placed along the long axis of the MTJ device. In a typical 1T1MTJ memory cell, the MTJ device may be electrically coupled to the metal level above, which may be a column line 504, while isolated from the metal level below, which may be a write row line 506. The aforementioned contact structure is then also isolated from the metal level below. In accordance with an illustrative embodiment of the present invention, the write row line 506 is aligned along the short axis of the MTJ device and the aforementioned contact structure is placed along the long axis of the MTJ device.

Each of at least a portion of the MTJ devices 502 corresponding to the memory cells 501 are preferably disposed at an intersection of a column line 504 and a corresponding write row line 506. In the case of shape-anisotropy dominated MTJ devices, each of the MTJ devices has an easy axis 514 along a long dimension of the MTJ device and a hard axis (not shown) associated therewith which is preferably orthogonal to the easy axis, as previously stated. In the exemplary 1T1MTJ memory circuit 500, the memory cells 501 are preferably electrically coupled to the column lines 504 but are not electrically connected to the corresponding write row lines 506. Instead, each of the MTJ devices 502a through 502d are connected to the transistors 503a through 503d, respectively, such that during a read operation, one terminal of the MTJ device (e.g., 502b) within a selected memory cell is coupled to ground (or an alternative voltage supply) via the corresponding transistor (e.g., 503b), while the other terminal of the MTJ device is connected to the corresponding column line 504.

An important aspect of the present invention is that the orientation of MTJ devices 502a through 502d in the MRAM array 500 are rotated, e.g., by about ninety degrees, compared to the orientation of the MTJ devices in conventional MRAM arrays, at least in part to reduce the size of the memory cells as explained above. Consequently, in the exemplary memory circuit 500, the bidirectional write current 310 traverses a write row line 506, the write select current 312 traverses at least a portion of column line 504, and the sense current 308 traverses a column line 504, thus generating a need for one or more read circuits in the column dimension and one or more write circuits in the row dimension.

Although the write row lines 506 are not electrically connected to the MTJ devices 502a through 502d, in a write operation, at least one row line preferably still serves as a conduit to carry the bidirectional current 310 in close proximity to the MTJ devices of its corresponding memory cells (e.g. 502c and 502d), as will be explained below.

The illustrative memory circuit 500 further includes a sense amplifier 556, column line circuits 552 and 554 operatively coupled to opposite ends of the column lines 504, and row line circuits 558 and 560 operatively coupled to opposite ends of the write row lines 506 and read row lines 507. At least one of the column line circuits 552, 554 operatively couples the sense current 308 from one of the memory cells 501 to the sense amplifier 556 during a read operation and directs the write selection current 312 in close proximity to a selected column of memory cells during a write operation and is this used for reading the logical state of one or more memory cells 501 and for write selection, respectively. Similarly, at least one of the row line circuits 558, 560 preferably generates the bidirectional write current 310 during a write operation, and is thus used for writing the logical state of one or more selected memory cells in the memory circuit 500.

During a read operation, the sense amplifier 556 connected to at least one of the column line circuits (e.g., 552) is configurable for determining the logical state of a given memory cell 501 and for generating a datum output (e.g., a logical "0" or "1") corresponding thereto. This may be accomplished, for example, by forcing a voltage across the MTJ device of a selected memory cell via the corresponding column line 504, and measuring the resulting sense current 308 flowing through the memory cell in comparison to a reference voltage. The reference current, which may be generated internally or externally with respect to the memory circuit 500, may be set such that the sense amplifier 556 can reliably distinguish between which of the two stable logical states the memory cell is in during the read operation. A high voltage, which may be the positive voltage supply VDD, applied to the read row line 507 selects which memory cell along the selected column line is to be sensed by shunting its respective MTJ device to ground (or an alternative voltage potential).

During a write operation, at least one of the column line circuits 552, 554 is configurable for supplying the write select current 312 via a column line 504 in close proximity to a subset of the memory cells 501 corresponding to the selected column line. As previously explained, the write select current 312 may be used to at least partially select one or more of the memory cells 501 for writing.

In a manner consistent with the column line circuits previously described in conjunction with the memory circuit of FIG. 4B, at least one of the column line circuits 552, 554 preferably includes an address input for receiving a column address 564 presented thereto. During a write operation the column address 564 may be used to select a particular column line 504, corresponding to a desired memory cell(s), on which the write select current 312 is to be conveyed. Similarly, during a read operation the column address 564 may be used to operatively connect a particular column line 504 (or column lines), corresponding to a desired memory cell (or memory cells) to be read, to the sense amplifier 556 (or sense amplifiers).

Column line circuits 552, 554 may further include a read/write input 566 for receiving a read/write signal presented thereto. The read/write signal may be used, at least in part, to selectively control whether the column line circuits 552, 554 are functioning in a read mode or a write mode of operation. Unlike conventional 1T1MTJ MRAM, column line circuits 552, 554 do not require a datum input since, during the write operation, they are used primarily for write selection and not for writing the logical state of the memory cells.

As previously stated, at least one of the row line circuits 558, 560 is configurable for supplying the bidirectional write current 310, via a selected write row line 506, to one or more selected memory cells 501 in the memory circuit 500. The bidirectional write current 310 may be used to write the logical state of one or more selected memory cells in the MRAM array. Like the row line circuit described in connection with the memory circuit of FIG. 4B, at least one of the row line circuits 558, 560 preferably includes an address input for receiving a row address 562 presented thereto. During the write operation the row address 562 may be used to select a particular write row line 506, corresponding to a selected memory cell(s), on which the bidirectional write current 310 is to be conveyed.

Write row line circuits 558, 560 may include a read/write input 570 for receiving a read/write signal. In a manner consistent with the read/write signal 566 previously discussed in connection with the column line circuits 552, 554, the read/write signal 570 may be used, at least in part, to selectively control whether the row line circuits 558, 560 are in a read mode or a write mode of operation. In contrast to word line circuits used in a conventional 1T1MTJ MRAM, the row line circuits 558, 560 further include a datum input 572 since, during the write operation, the row line circuits are used primarily for writing the logical state of the memory cells 501.

While prior illustrative embodiments of the present invention described herein relate to read and write operations directed primarily to one memory cell within an array of memory cells, the invention further contemplates that the read operation or write operation may simultaneously operate on a plurality of memory cells within the memory array. A read operation may therefore employ one or more sense currents 308. A write operation may employ one or more write select currents 312 and one or more bidirectional write currents 310.

Employing rotated MTJ cells in the memory circuit of the present invention may require some modification of the read or write circuitry (e.g., column line circuits and/or row line circuits) to provide read and/or write access to a subset of memory cells in the memory circuit. For example, in the conventional cross-point memory array depicted in FIG. 3B, memory cells 302c and 302d sharing the same row line 306 can be read simultaneously using two separate sense currents 308 and corresponding sense amplifiers (traversing a portion of the two bit lines 304), during a read operation, and written simultaneously using two separate bidirectional write currents 310 (traversing the two bit lines 304) and one write select current 312 (traversing the lower row line 306), during a write operation.

By contrast, using the techniques of the present invention, memory cells along a row line 406 (e.g., memory cells 402c and 402d) in the illustrative memory circuit 450 shown in FIG. 4B, cannot be written simultaneously in a single write operation since the bidirectional write current 310 is conveyed by a row line 406. For example, a single bidirectional write current 310 is presented to both memory cells 402c and 402d along row line 406 and thus cannot be simultaneously used to write memory cell 402c to one state and memory cell 402d to a different state. Hence, memory cells 402c and 402d can be read in parallel (with two sense currents 308), but not written in parallel. In the illustrative memory circuit 450, the same group of memory cells cannot be written in one cycle and read in a subsequent cycle, or read in one cycle and written in a subsequent cycle.

The orientation of the easy axis of the MTJ device in a given memory cell has been described herein as being due entirely to shape-anisotropy. However, the present invention also contemplates that the orientation of the easy axis of the MTJ device may be determined by intrinsic anisotropy of the magnetic materials comprising the MTJ device, or by a combination of shape-anisotropy and intrinsic anisotropy, as will be understood by those skilled in the art. However, it is to be appreciated that each magnetic memory cell has a particular easy axis associated therewith, irrespective of the type of anisotropy that defines the easy axis of the memory cell.

At least a portion of the MRAM architecture of the present invention may be implemented in a semiconductor device, which may comprise one or more of such magnetic memory circuits. The techniques of the invention described herein may be used to achieve improvements over conventional magnetic memory architectures.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A magnetic random access memory circuit, comprising:
   a plurality of magnetic memory cells, each of the memory cells comprising a magnetic storage element having an easy axis and a hard axis associated therewith;
   a plurality of column lines and row lines for selectively accessing one or more of the memory cells, each of the memory cells being proximate to an intersection of one of the column lines and one of the row lines; and
   at least one row line circuit configurable for generating a write current for writing a logical state of one or more of the memory cells, the at least one row line circuit being operatively coupled to the row lines, the write current being conveyed in a substantially same direction via the row lines; and
   at least one column line circuit configurable for generating at least one of a sense current and a sense voltage for reading the logical state of one or more of the memory cells, the at least one column line circuit being operatively coupled to the column lines, the column lines conveying to the one or more memory cells the at least one of the sense current and the sense voltage;
   wherein the row lines are substantially orthogonal to the easy axis of the magnetic storage element in each of the memory cells.

2. The circuit of claim 1, wherein the at least one row line circuit comprises control circuitry for controlling a direction of the write current.

3. The circuit of claim 1, wherein the at least one row line circuit includes a datum input for receiving a data signal, the at least one row line circuit being configurable for controlling a direction of the write current in response to the data signal.

4. The circuit of claim 1, wherein the write current is bidirectional.

5. The circuit of claim 1, wherein the at least one column line circuit comprises at least one sense amplifier and control circuitry, the control circuitry being operative to selectively connect the at least one sense amplifier to one of the column lines for reading the logical state of one or more of the memory cells corresponding thereto.

6. The circuit of claim 1, wherein the easy axis associated with each of the plurality of magnetic memory cells is determined at least in part by intrinsic anisotropy.

7. The circuit of claim 1, wherein the easy axis associated with each of the plurality of magnetic memory cells is determined at least in part by shape-anisotropy.

8. The circuit of claim 1, wherein each of at least a portion of the magnetic memory cells comprises a magnetic tunnel junction device.

9. The circuit of claim 1, wherein the column lines are arranged substantially orthogonal to the row lines.

10. The circuit of claim 1, wherein each of at least a portion of the memory cells includes first and second terminals, the first terminal being electrically connected to one of the column lines and the second terminal being electrically connected to one of the row lines.

11. The circuit of claim 1, wherein the at least one column line circuit is further configurable for generating a write select current, the write select current being conveyed in a substantially same direction via the column lines.

12. A semiconductor device including at least one magnetic random access memory (MRAM) circuit, the at least one MRAM circuit comprising:
   a plurality of magnetic memory cells, each of the memory cells comprising a magnetic storage element having an easy axis and a hard axis associated therewith;
   a plurality of column lines and row lines for selectively accessing one or more of the memory cells, each of the memory cells being proximate to an intersection of one of the column lines and one of the row lines; and
   at least one row line circuit configurable for generating a write current for writing a logical state of one or more of the memory cells, the at least one row line circuit being operatively coupled to the row lines, the write current being conveyed in a substantially same direction via the row lines; and
   at least one column line circuit configurable for generating at least one of a sense current and a sense voltage for reading the logical state of one or more of the memory cells, the at least one column line circuit being operatively coupled to the column lines, the column lines conveying to the one or more memory cells the at least one of the sense current and the sense voltage;
   wherein the row lines are substantially orthogonal to the easy axis of the magnetic storage element in each of the memory cells.

13. The semiconductor device of claim 12, wherein the at least one row line circuit includes a datum input for receiving a data signal, the at least one row line circuit being configurable for controlling a direction of the write current in response to the data signal.

* * * * *